US012813188B2

(12) United States Patent
Omori et al.

(10) Patent No.: US 12,813,188 B2
(45) Date of Patent: Nov. 24, 2026

(54) PURGING DEVICE, AND CONTAINER STORAGE FACILITY INCLUDING PURGING DEVICE

(71) Applicant: Daifuku Co., Ltd., Osaka (JP)

(72) Inventors: Kazuya Omori, Hinocho (JP); Ryo Yamashita, Hinocho (JP); Akihiro Yoshioka, Hinocho (JP); Akira Masui, Hinocho (JP); Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 905 days.

(21) Appl. No.: 17/972,976

(22) Filed: Oct. 25, 2022

(65) Prior Publication Data

US 2023/0125666 A1 Apr. 27, 2023

(30) Foreign Application Priority Data

Oct. 26, 2021 (JP) ................................ 2021-174884

(51) Int. Cl.

*H10P 72/00* (2026.01)
*H10P 72/10* (2026.01)
*H10P 72/30* (2026.01)

(52) U.S. Cl.

CPC ...... *H10P 72/0402* (2026.01); *H10P 72/1924* (2026.01); *H10P 72/3404* (2026.01)

(58) Field of Classification Search

CPC ......... H01L 21/67017; H01L 21/67389; H01L 21/67769; Y02E 30/30; H10P 72/0402; H10P 72/1924; H10P 72/3404

USPC ........................................................... 141/98

See application file for complete search history.

(56) References Cited

U.S. PATENT DOCUMENTS

| | | | | |
|---|---|---|---|---|
| 6,368,411 | B2 * | 4/2002 | Roberson, Jr. | H10P 72/1924 414/217 |
| 9,305,817 | B2 * | 4/2016 | Kaise | H01L 21/67393 |
| 10,354,898 | B2 * | 7/2019 | Abe | H10P 72/0612 |
| 10,438,829 | B2 * | 10/2019 | Murata | H01L 21/67253 |
| 10,607,872 | B2 * | 3/2020 | Tanaka | H01L 21/67769 |
| 10,658,213 | B2 * | 5/2020 | Abe | B65B 31/04 |
| 11,183,391 | B2 * | 11/2021 | Tseng | H01L 21/6719 |
| 11,367,642 | B2 * | 6/2022 | Kinoshita | F27D 3/0084 |

(Continued)

FOREIGN PATENT DOCUMENTS

| | | | |
|---|---|---|---|
| JP | 6052469 | B2 | 12/2016 |
| JP | 2019108220 | A | 7/2019 |

(Continued)

*Primary Examiner* — Kenneth Rinehart
*Assistant Examiner* — Stephanie A Shrieves
(74) *Attorney, Agent, or Firm* — The Webb Law Firm

(57) ABSTRACT

After the start of supply of a purge gas to a storage container, a supply rate control unit performs supply rate increase control to gradually increase the supply rate such that the supply rate reaches a first flow rate, and after the supply rate reaches the first flow rate, the supply rate control unit performs supply rate maintenance control to maintain the supply rate at the first flow rate or larger. A discharge rate control unit keeps a discharge rate at zero while the supply rate increase control is being executed, and when the supply rate reaches the first flow rate, the discharge rate control unit performs discharge rate maintenance control to maintain the discharge rate at or below a second flow rate smaller than the first flow rate.

6 Claims, 5 Drawing Sheets

(56) References Cited

U.S. PATENT DOCUMENTS

| | | | | |
|---|---|---|---|---|
| 2014/0045278 | A1* | 2/2014 | Yoshida | C23C 16/54 438/5 |
| 2016/0358799 | A1* | 12/2016 | Murata | H01L 21/67393 |
| 2017/0140949 | A1* | 5/2017 | Onishi | G05D 7/0635 |
| 2018/0229277 | A1* | 8/2018 | Onishi | F16K 21/00 |
| 2019/0019705 | A1* | 1/2019 | Nakada | C23C 16/45578 |
| 2019/0189486 | A1 | 6/2019 | Abe et al. | |

FOREIGN PATENT DOCUMENTS

| | | | |
|---|---|---|---|
| WO | 2015166710 | A1 | 11/2015 |
| WO | 2015194252 | A1 | 12/2015 |

* cited by examiner

PURGING DEVICE, AND CONTAINER STORAGE FACILITY INCLUDING PURGING DEVICE

CROSS-REFERENCE TO RELATED APPLICATION

This application claims priority to Japanese Patent Application No. 2021-174884 filed Oct. 26, 2021, the disclosure of which is hereby incorporated by reference in its entirety.

BACKGROUND OF THE INVENTION

1. Field of the Invention

The present invention relates to a purging device for using a purge gas to purge the inside of a storage container for storing a target object, and a container storage facility that includes the purging device.

2. Description of the Related Art

As one example, Japanese Patent No. 6052469 (Patent Document 1) discloses technology for performing so-called purging, that is to say injecting a purge gas into the inside of a storage container for storing a target object such as a semiconductor wafer or a glass substrate, in order to keep the inside of the storage container clean. The reference numerals in parentheses in the following description of the related art are the reference numerals used in Patent Document 1.

In the technology disclosed in Patent Document 1, the purge gas is supplied to the inside (54) of the storage container (50), and the purge gas is discharged from the inside (54) of the storage container (50). The supply rate of the purge gas can be adjusted to one of at least two levels, namely a first flow rate and a second flow rate that is larger than the first flow rate, and control is performed such that when the supply rate of the purge gas is the first flow rate, the rate of discharge of the purge gas from the inside (54) of the storage container (50) is set to zero. Even when the supply rate of the purge gas is the first flow rate, which is smaller than the second flow rate, the pressure in the inside (54) of the storage container (50) can be prevented from becoming a negative pressure by setting the rate of discharge of the purge gas from the inside (54) of the storage container (50) to zero. Accordingly, the technology disclosed in Patent Document 1 attempts to avoid the case where outside dirty air and dust are sucked into the inside (54) of the storage container (50).

SUMMARY OF THE INVENTION

Although Patent Document 1 discloses that the flow rate of the purge gas is controlled using two levels, there is no disclosure regarding how the discharge rate is controlled during change in the supply rate.

In view of the above-described actual situation, there is desire for the ability to appropriately control the discharge rate of the purge gas discharged from the storage container during change in the supply rate of the purge gas supplied to the storage container, while also avoiding negative pressure in the inside of the storage container during purging.

The following describes technology for solving the above problems.

One aspect of the present invention is a purging device configured to use a purge gas to purge an inside of a storage container in which a target object is storable, the purging device including:

- a supply pipe configured to supply the purge gas to the storage container by being connected to the storage container;
- a supply rate control unit configured to control a supply rate of the purge gas supplied to the storage container via the supply pipe;
- a discharge pipe configured to discharge the purge gas from the storage container by being connected to the storage container; and
- a discharge rate control unit configured to control a discharge rate of the purge gas discharged from the storage container via the discharge pipe,
- wherein after a start of supply of the purge gas to the storage container, the supply rate control unit performs supply rate increase control to gradually increase the supply rate in such a manner that the supply rate reaches a first flow rate, and after the supply rate reaches the first flow rate, the supply rate control unit performs supply rate maintenance control to maintain the supply rate at the first flow rate or larger, and
- the discharge rate control unit keeps the discharge rate at zero while the supply rate increase control is being executed, and, after the supply rate reaches the first flow rate, the discharge rate control unit performs discharge rate maintenance control to maintain the discharge rate at or below a second flow rate smaller than the first flow rate.

According to this configuration, the internal pressure of the storage container can possibly also be low during the period from when the supply of the purge gas to the storage container is started until when the purge gas supply rate reaches the first flow rate, but the purge gas discharge rate is set to zero during that period, thus making it possible to avoid negative pressure inside the storage container. After the supply rate of the purge gas supplied to the storage container reaches the first flow rate, the discharge of the purge gas is started, and the discharge rate is maintained at the second flow rate that is smaller than the first flow rate, and therefore the flow rate of purge gas supplied to the inside of the storage container can be maintained larger than the flow rate of purge gas discharged from the inside of the storage container. Accordingly, it is possible to prevent negative pressure in the inside of the storage container while appropriately discharging the purge gas. Therefore, it is possible to avoid the case where external air and dust are sucked into the inside of the storage container. Furthermore, according to the above configuration, the supply rate is gradually increased in the supply rate increase control, thus making it possible to minimize vibration of the target object stored in the storage container. Therefore, the above configuration is particularly suitable in the case where the target object is an object that is vulnerable to vibration, such as a semiconductor wafer. As described above, according to the above configuration, it is possible to appropriately control the discharge rate of the purge gas discharged from the storage container during change in the supply rate of the purge gas supplied to the storage container, while also avoiding negative pressure in the inside of the storage container during purging.

Further features and advantages of the technology according to the present disclosure will become apparent from the following description of exemplary and non-limiting embodiments described with reference to the drawings.

DESCRIPTION OF THE INVENTION

A purging device and a container storage facility that includes the purging device will be described below with reference to the drawings.

Figure 1:
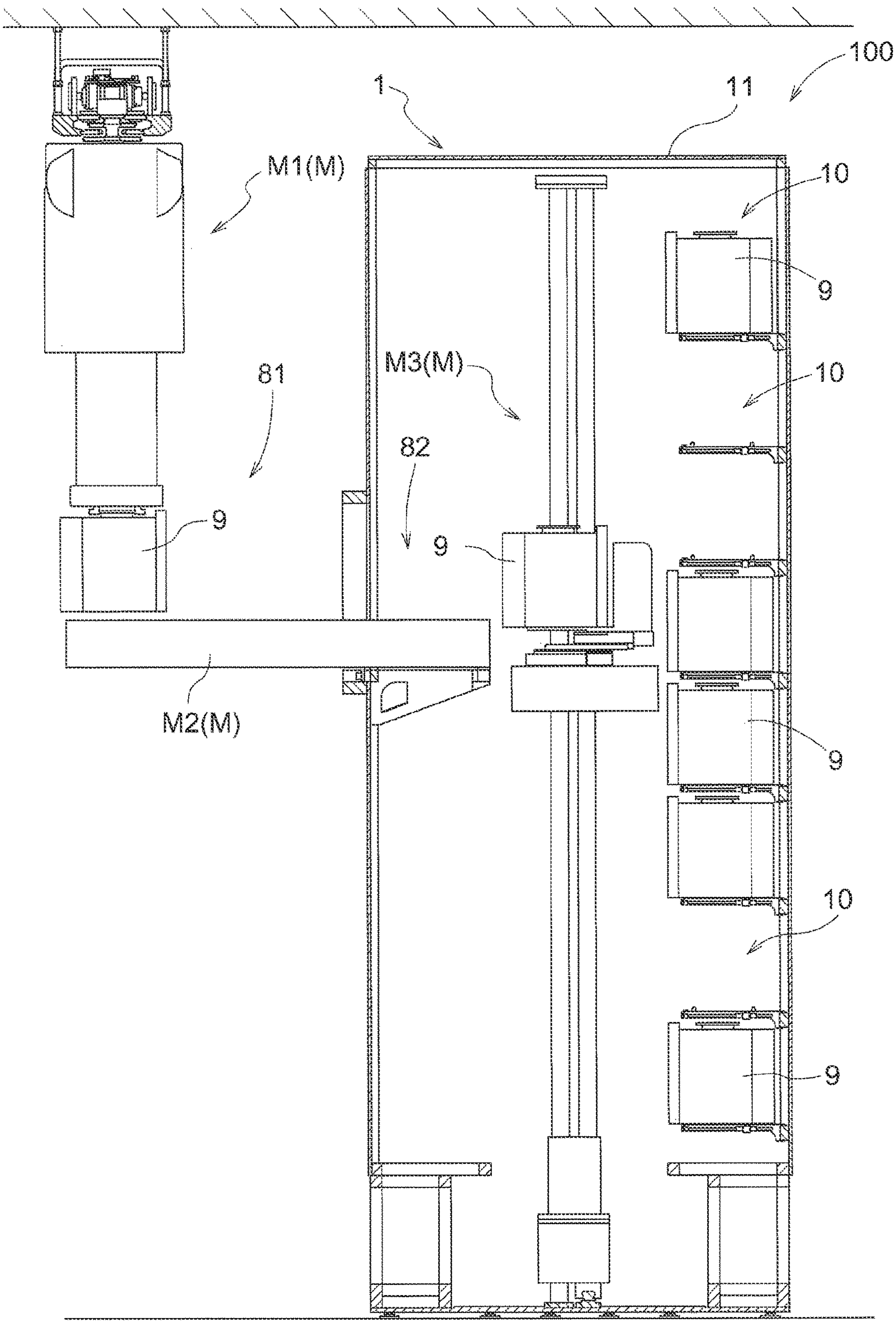
FIG. 1 is a side view of a container storage facility.
Figure 2:
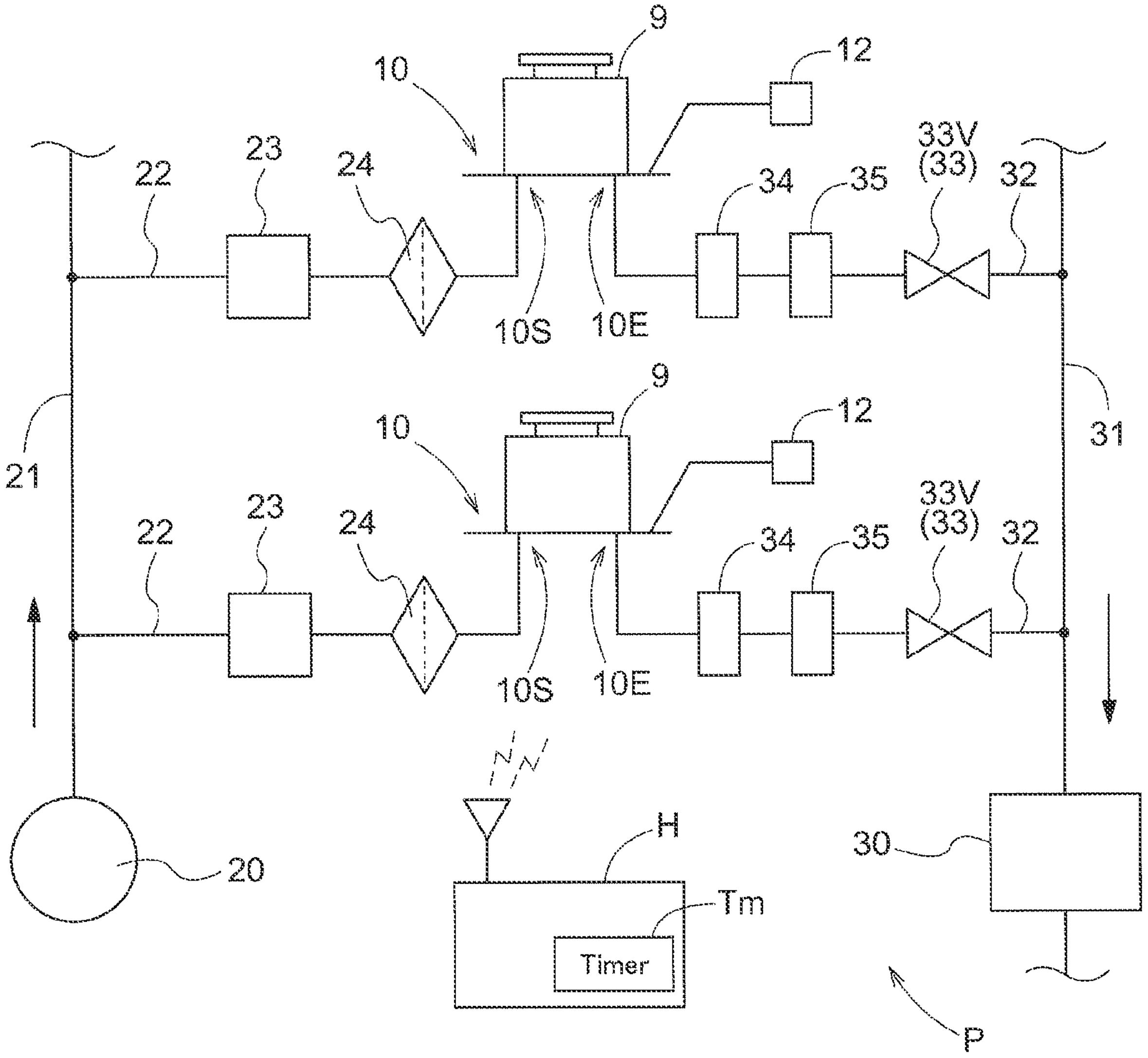
FIG. 2 is a conceptual diagram of a purging device.

As shown in FIG. 1, a container storage facility 100 includes a container storage shelf 1 provided with placement units 10 on which storage containers 9 can be placed, and a purging device P (see FIG. 2). The purging device P is a device for using a purge gas to purge the inside of the storage containers 9, which are for storing target objects (not shown). In the present embodiment, the container storage shelf 1 includes a plurality of placement units 10. The purging device P is capable of purging the inside of the storage container 9 mounted on any of the placement units 10.

In the present embodiment, the storage containers 9 placed on the placement units 10 are each a container into which an inert gas serving as the purge gas is supplied. For example, the storage containers 9 are a FOUP (Front Opening Unified Pod) in which semiconductor wafers are stored. However, the present invention is not limited to this, and the storage containers 9 may be a reticle pod in which reticles are stored.

In purging, a purge gas is supplied to the inside of the storage container 9 in order to suppress oxidation of semiconductor wafers stored in the storage container 9 (FOUP) or reticles stored in the container 9 (reticle pod), as well as clean the inside of the storage container 9. Purging makes it possible to maintain an environment suitable for storage in the inside of the storage container 9. Accordingly, semiconductor wafers, reticles, or the like stored in the storage container 9 can be stored in a favorable condition. An inert gas such as nitrogen gas or cleaned air is used as the purge gas, for example.

In the present embodiment, the storage container storage shelf 1 includes wall bodies 11 that cover a plurality of placement units 10. The placement units 10 are arranged side by side along the up-down direction and the left-right direction (horizontal direction). A storage container 9 can be placed on each of the placement units 10. In this example, one storage container 9 can be placed on one placement unit 10.

In the present embodiment, the storage container storage facility 100 includes transport devices M that transport the storage containers 9. The transport devices M are configured to perform a loading operation for transporting the storage containers 9 to the storage container storage shelf 1 and an unloading operation for transporting the storage containers 9 from the storage container storage shelf 1.

In the present embodiment, the transport device M includes a first transport device M1 for transporting a storage container 9 from another location to an loading/unloading port 81 located outside the storage container storage shelf 1, a second transport device M2 that transports the storage container 9 from the loading/unloading port 81 of the container storage shelf 1 to a transfer position 82 located inside the container storage shelf 1, and a third transport device M3 for transporting the storage container 9 from the transfer position 82 to a placement unit 10 in the container storage shelf 1. Note that the first transport device M1, the second transport device M2, and the third transport device M3 also perform transport in directions opposite to those described above.

The first transport device M1 is configured as an overhead transport vehicle that holds a storage container 9 while traveling along a rail provided on the ceiling, for example. Also, the first transport device M1 has an elevating mechanism and is able to raise and lower the storage container 9. In other words, the first transport device M1 transports the storage container 9 from another location to the loading/unloading port 81 of the container storage shelf 1, and then transfers the storage container 9 to the second transport device M2 located below the first transport device M1. The first transport device M1 also receives a storage container 9 from the second transport device M2 at the loading/unloading port 81 of the container storage shelf 1, and transports the storage container 9 from the loading/unloading port 81 to another location.

The second transport device M2 is configured as a conveyor, for example. A conveyor that employs a carrier, a belt conveyor, a roller conveyor, a chain conveyor, or the like may be used as the second transport device M2. The second transport device M2 extends from a position outside the container storage shelf 1 to a position inside the container storage shelf 1. The second transport device M2 receives a storage container 9 from the first transport device M1 at the loading/unloading port 81 located outside the container storage shelf 1, and then transports the storage container 9 to the transfer position 82 located inside the container storage shelf 1, and transfers the storage container 9 to the third transport device M3 at the transfer position 82. The second transport device M2 also receives a storage container 9 from the third transport device M3 at the transfer position 82 inside the container storage shelf 1, transports the storage container 9 to the loading/unloading port 81 of the container storage shelf 1, and transfers the storage container 9 to the first transport device M1 at the loading/unloading port 81.

The third transport device M3 is arranged inside the container storage shelf 1, and is configured as a stacker crane having an elevating mechanism for movement in the up-down direction and a traveling mechanism for movement in the left-right direction, for example. While holding a storage container 9, the third transport device M3 moves in the up-down direction and the left-right direction and transports the storage container 9 to one of the placement units 10 arranged side by side along the up-down direction and the left-right direction. The third transport device M3 also receives a storage container 9 from the second transport device M2 at the transfer position 82 inside the container storage shelf 1, and transports the storage container 9 to one of the placement units 10. The third transport device M3 also transports a storage container 9 from one of the placement units 10, and transfers the storage container 9 to the second transport device M2 at the transfer position 82.

FIG. 2 is a conceptual diagram of the purging device P according to the present embodiment.

As shown in FIG. 2, the purging device P includes a purge gas supply source 20, a main supply pipe 21 through which the purge gas supplied from the supply source 20 flows, a main discharge pipe 31 through which the purge gas discharged from the storage container 9 flows, and a negative pressure generator 30. In addition to the purge gas discharged from the storage container 9, air discharged from the inside of the storage container 9 at the initial stage of purge processing also flows through the main discharge pipe 31.

The purging device P includes supply pipes 22 that can be connected to the storage containers 9 and supply purge gas to the storage containers 9. In the present embodiment, the supply pipes 22 branch off from the main supply pipe 21 and are connected to corresponding placement units 10. In this example, a plurality of supply pipes 22 branch off from one main supply pipe 21 and are each connected to a corresponding placement unit 10.

The purging device P includes supply rate control units 23 that control the supply rate of the purge gas supplied to the storage containers 9 via the supply pipes 22. The supply rate control units 23 are configured as a mass flow controller that controls the mass flow rate of the purge gas, for example, and control the mass flow rate of the purge gas flowing through the supply pipes 22. However, rather than being limited to this, the supply rate control units 23 need only be able to control the flow rate of the purge gas, and may be configured to control the volumetric flow rate of the purge gas, for example. In this example, a supply rate control unit 23 is provided for each of the supply pipes 22.

In the present embodiment, the purging device P includes filters 24 that remove impurities from the purge gas. The filters 24 are provided upstream of the placement units 10 with respect to the flow direction of the purge gas. Accordingly, purge gas from which impurities have been removed can be supplied to the placement units 10. In the present embodiment, the filters 24 are provided in the supply pipes 22. Specifically, the filters 24 are provided downstream of the supply rate control units 23 in the supply pipes 22. In this example, a filter 24 is provided in each of the supply pipes 22.

Each of the placement units 10 includes a supply port 10S connected to a corresponding supply pipe 22. The supply port 10S is connected to the storage container 9 while a storage container 9 has been placed on the placement unit 10. Accordingly, the purge gas flowing through the supply pipe 22 is supplied to the inside of the storage container 9. In this example, the supply port 10S is provided in each of the placement units 10.

In the present embodiment, the placement unit 10 is provided with a detection unit 12 that detects the placement of a storage container 9. The detection unit 12 is configured as a load sensor. A photoelectric sensor, a proximity sensor, or another known sensor can be used as the load sensor. The supply rate control unit 23 controls the supply rate of the purge gas supplied to the storage container 9 based on the detection result from the detection unit 12. In this example, a detection unit 12 is provided in each of the placement units 10.

The purging device P includes discharge pipes 32 that are connected to the storage containers 9 to discharge the purge gas from the storage containers 9. In the present embodiment, the discharge pipes 32 extend from the placement units 10 and are connected to the main discharge pipe 31. In this example, a discharge pipe 32 is connected to each of the placement units 10. The discharge pipes 32 merge with the main discharge pipe 31.

Each of the placement units 10 includes a discharge port 10E connected to a corresponding discharge pipe 32. The discharge port 10E is connected to a storage container 9 while the storage container 9 has been placed on the placement unit 10. Accordingly, the purge gas discharged from the inside of the storage container 9 flows through the discharge pipe 32. In this example, a discharge port 10E is provided in each of the placement units 10. The discharge pipes 32 are connected to the discharge ports 10E of the corresponding placement units 10.

The purging device P includes a discharge rate control unit 33 that controls the discharge rate of the purge gas discharged from the storage containers 9 via the discharge pipes 32. In the present embodiment, the discharge rate control unit 33 includes discharge valves 33V respectively provided for the discharge pipes 32. The discharge valves 33V control the flow rate of the purge gas by changing the cross sectional area of the flow paths of the discharge pipes 32. Note that the discharge valves 33V may be a value whose degree of opening can be changed in a plurality of levels or continuously, or a valve that is simply opened and closed linearly. In this example, the discharge valves 33V are configured such that the degree of opening of the valves change according to the supply of power. A solenoid valve, for example, can be used as the discharge valves 33V. However, the present invention is not limited to this, and various known valves can be used as the discharge valves 33V.

In the present embodiment, the purging device P includes hygrometers 34 that measure the humidity inside the storage containers 9. In this example, the hygrometers 34 are provided in the discharge pipes 32 at positions downstream of the placement units 10, and measure the humidity of the purge gas (air containing the purge gas) discharged from the storage containers 9. In the illustrated example, the hygrometers 34 are provided in the discharge pipes 32 at positions upstream of the discharge rate control units 33. In the present embodiment, the hygrometers 34 also have a temperature detecting function. In other words, the hygrometers 34 are configured as a thermohygrometer. In this example, a hygrometer 34 is provided for each of the discharge pipes 32.

In the present embodiment, the purging device P includes flow meters 35 that measure the flow rate of the purge gas flowing through the discharge pipes 32. The flow meters 35 are provided in the discharge pipes 32 at positions upstream of the discharge rate control units 33. In the illustrated example, the flow meters 35 are provided in the discharge pipes 32 at positions downstream of the hygrometers 34. In this example, a flow meter 35 is provided for each of the discharge pipes 32.

As mentioned above, the purging device P includes the negative pressure generator 30. The negative pressure generator 30 generates negative pressure in the discharge pipes 32. When a negative pressure is generated in the discharge pipes 32, the gas inside the storage containers 9 connected to the discharge pipes 32 is sucked into the discharge pipes 32. In the present embodiment, the negative pressure generator 30 is provided in the main discharge pipe 31, and generates negative pressure in the main discharge pipe 31 so as to generate negative pressure in each of the discharge pipes 32 connected to the main discharge pipe 31. In other words, in the present embodiment, a plurality of the discharge pipes 32 are connected to the one negative pressure generator 30. Accordingly, the purge gas can be discharged from storage containers 9 placed on a plurality of placement units 10 with use of one negative pressure generator 30. Therefore, compared to the case where a negative pressure generator 30 is provided for each of the placement units 10 (discharge pipes 32), it is easier to simplify the configuration and reduce the cost. In this example, the negative pressure generator 30 includes a pump, for example, and generates negative pressure in the discharge pipes 32 by driving the pump.

In the present embodiment, the container storage facility 100 includes a host controller H that performs overall management of the facility. In this example, the host controller H controls operations of the transport device M and operations of the purging device P. The host controller H includes a processor such as a microcomputer, and peripheral circuitry such as a memory, for example. Various functions are realized through cooperation between such hardware and a program executed on a processor in a computer or the like.

The host controller H controls the supply rate control units 23 and the discharge rate control units 33. In the present embodiment, the host controller H controls each of the supply rate control units 23, each of the discharge rate control units 33, the supply source 20, and the negative pressure generator 30. Also, the host controller H can acquire detection results from various detection units provided in the purging device P. In this example, the host controller H can acquire detection results from the detection units 12 provided for the placement units 10 and measurement results from the hygrometers 34 and the flow meters 35 provided in the discharge pipes 32.

In the present embodiment, the host controller H includes a timer Tm. The host controller H controls the purging device P based on the time measured by the timer Tm. Specifically, the host controller H outputs various commands to the supply rate control units 23 and the discharge rate control units 33 based on the time measured by the timer Tm.

The purging of the storage containers 9 is performed through control of the supply rate by the supply rate control units 23 and control of the discharge rate by the discharge rate control units 33. In the present embodiment, the supply rate control units 23 and the discharge rate control units 33 receive commands from the host controller H and control corresponding units.

Figure 3:
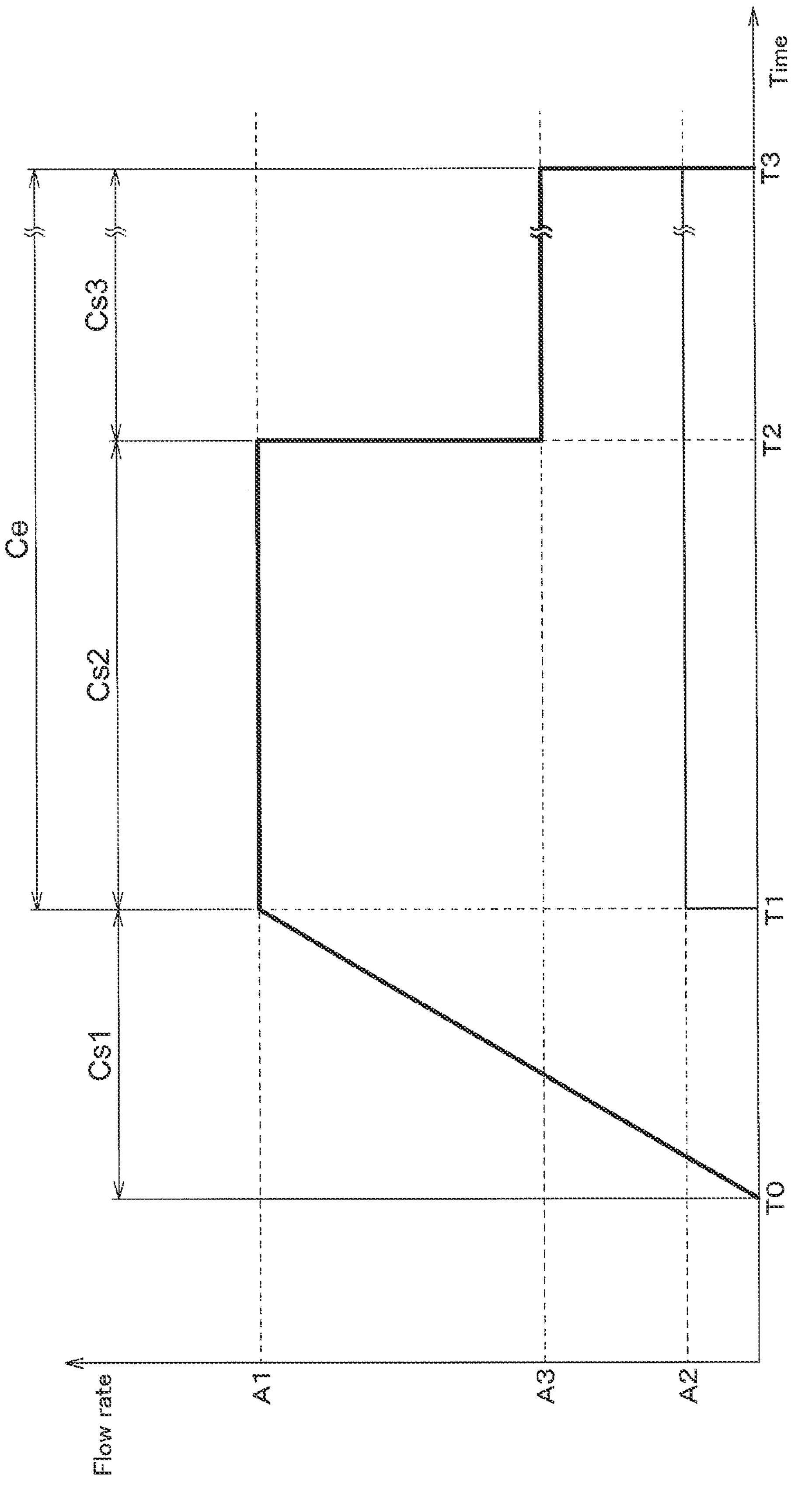
FIG. 3 is a time chart of purge processing.

FIG. 3 is a time chart of purge processing. Purge processing will be described below with reference to FIG. 3.

As shown in FIG. 3, the supply rate control unit 23 performs supply rate increase control Cs1 for gradually increasing the supply rate such that the supply rate of the purge gas supplied to the storage container 9 reaches a first flow rate A1. In the present embodiment, a supply start time point T0 at which the supply of the purge gas to the storage container 9 is started, the supply rate control unit 23 performs the supply rate increase control Cs1 for gradually increasing the supply rate such that the supply rate reaches the first flow rate A1 at a predetermined elapse time T1. In this example, the supply rate is zero at the purge gas supply start time point T0. In the present embodiment, in the supply rate increase control Cs1, the supply rate control unit 23 gradually increases the purge gas supply rate from zero to the first flow rate A1. In other words, the supply rate control unit 23 increases the supply rate at a constant rate of increase from the purge gas supply start time point T0 to the predetermined elapse time T1. Accordingly, it is possible to minimize vibration of the target object stored in the storage container 9 caused by the purge gas. Such a configuration is particularly suitable in the case where the target object is an object that is vulnerable to vibration, such as a semiconductor wafer. Note that the "supply rate" is the flow rate of purge gas supplied per unit time, and the unit is "L/min", for example. Similarly, the later-described "discharge rate" is the flow rate of purge gas discharged per unit time, and the unit is "L/min", for example.

In the present embodiment, the supply rate control unit 23 starts supplying purge gas to the storage container 9 when the detection unit 12 detects that the storage container 9 has been placed on the placement unit 10. In other words, the supply rate control unit 23 performs the supply rate increase control Cs1 based on the detection result from the detection unit 12 (steps #1 and #2 in FIG. 4).

After the supply rate reaches the first flow rate A1, the supply rate control unit 23 performs supply rate maintenance control Cs2 for maintaining the supply rate at the first flow rate A1 or above. In the present embodiment, after starting the supply rate increase control Cs1, upon reaching the predetermined elapse time T1 after the supply start time point T0, the supply rate control unit 23 performs the supply rate maintenance control Cs2 to maintain the supply rate at the first flow rate A1 or above. In this example, in the supply rate maintenance control Cs2, the supply rate control unit 23 maintains the supply rate at approximately the first flow rate A1.

In the present embodiment, the predetermined time (T1−T0) is set such that the rate of increase of the supply rate up to the first flow rate A1 is in the upper limit region of the range in which the target object in the storage container 9 does not vibrate due to the supply of the purge gas. Accordingly, it is possible to quickly achieve a clean state in which the inside of the storage container 9 is filled with an appropriate amount of purge gas, while also avoiding vibration of the target object inside the storage container 9 caused by the purge gas. Note that the "upper limit region" is a range of values set lower than the upper limit value, which is the limit at which the target object does not vibrate. Since the actual upper limit value fluctuates according to various factors, the upper limit region is set lower than the upper limit value such that the target object does not vibrate due to fluctuations in the upper limit value either. For example, the "upper limit region" is preferably set in the range of 80 to 95% of an experimentally determined upper limit value.

The discharge rate control unit 33 keeps the discharge rate at zero during execution of the supply rate increase control Cs1, and after the supply rate reaches the first flow rate A1, performs discharge rate maintenance control Ce for maintaining the discharge rate at or below a second flow rate A2 that is smaller than the first flow rate A1. In the present embodiment, the discharge rate control unit 33 keeps the discharge rate at zero for a predetermined time since the supply start time point (i.e., for T0 to T1), and then at the time T1 when a predetermined time has elapsed since the supply start time point T0, performs the discharge rate maintenance control Ce to maintain the discharge rate at or below the second flow rate A2 that is smaller than the first flow rate A1. As a result, at the time T1 when a predetermined time has elapsed since the purge gas supply start time point T0, the purge gas is supplied to the storage container 9 at the first flow rate A1 in the supply rate maintenance control Cs2, and the purge gas in the inside of the storage container 9 is discharged at the second flow rate A2, which is smaller than the first flow rate A1, in the discharge rate maintenance control Ce. For this reason, from the time T1 when a predetermined time has elapsed since the purge gas supply start time point T0, the flow rate of the purge gas supplied to the inside of the storage container 9 can be kept larger than the flow rate of the purge gas discharged from the inside of the storage container 9. Accordingly, it is possible to avoid negative pressure in the inside of the storage container 9 while appropriately discharging the purge gas. Due to the adjustment of the discharge rate being triggered by the elapse of the predetermined time T1 from the purge gas supply start time point T0, the control configuration can be simpler than in the case where change in the supply rate is used as a trigger, for example. In this example, the discharge rate control unit 33 maintains the discharge rate at approximately the second flow rate A2 in the discharge rate maintenance control Ce. The second flow rate A2 is preferably a flow rate of about 10% to 15% of the first flow rate A1, for example.

In the present embodiment, at a time T2 when a predetermined filling time has elapsed since the start time point T1 of the supply rate maintenance control Cs2, the supply rate control unit 23 performs post-filling maintenance control Cs3 to maintain the supply rate at a third flow rate A3 that is smaller than the first flow rate A1 and larger than the second flow rate A2. Accordingly, the purge gas can be continuously supplied to the storage container 9 at the third flow rate A3, which is smaller than the first flow rate A1. This post-filling maintenance control Cs3 is suitable for the case where the storage container 9 is stored on the placement unit 10 for a long period of time, for example, and executing the post-filling maintenance control Cs3 makes it possible to avoid the intrusion of external air and dust into the inside of the storage container 9 while the storage container 9 is being stored. The "filling time" is set based on achieving a clean state for the inside of the storage container 9, and can vary depending on the characteristics and size of the storage container 9, for example. The third flow rate A3 may be a flow rate of about 30% to 50% of the first flow rate A1, for example.

In the present embodiment, the discharge rate control unit 33 continues executing the discharge rate maintenance control Ce while the supply rate control unit 23 is executing the post-filling maintenance control Cs3. Accordingly, while the supply rate control unit 23 is executing the post-filling maintenance control Cs3, the purge gas is supplied to the storage container 9 at the third flow rate A3, and the purge gas is discharged from the inside of the storage container 9 at the second flow rate A2, which is smaller than the third flow rate A3, in the discharge rate maintenance control Ce. For this reason, from the time T2 when the supply rate control unit 23 starts the post-filling maintenance control Cs3, the flow rate of the purge gas supplied to the inside of the storage container 9 can be kept larger than the flow rate of the purge gas discharged from the inside of the storage container 9. Accordingly, it is possible to avoid negative pressure in the inside of the storage container 9 while appropriately discharging the purge gas. The second flow rate A2 may be about 20% to 40% of the third flow rate A3, for example.

In the example shown in FIG. 3, the purge processing performed from the time T0 to the time T2 is sometimes called "initial purge". Also, the purge processing performed from the time T2 to the time T3 is sometimes called "maintenance purge". In other words, the purging device P is configured to perform initial purge and maintenance purge.

Note that the first flow rate A1, the second flow rate A2, and the third flow rate A3 are appropriately determined based on the characteristics and size of the storage container 9, for example. The characteristics of the storage container 9 include the degree of airtightness of the storage container 9. The degree of airtightness can also affect the setting of the first flow rate A1, the second flow rate A2, and the third flow rate A3.

Figure 4:
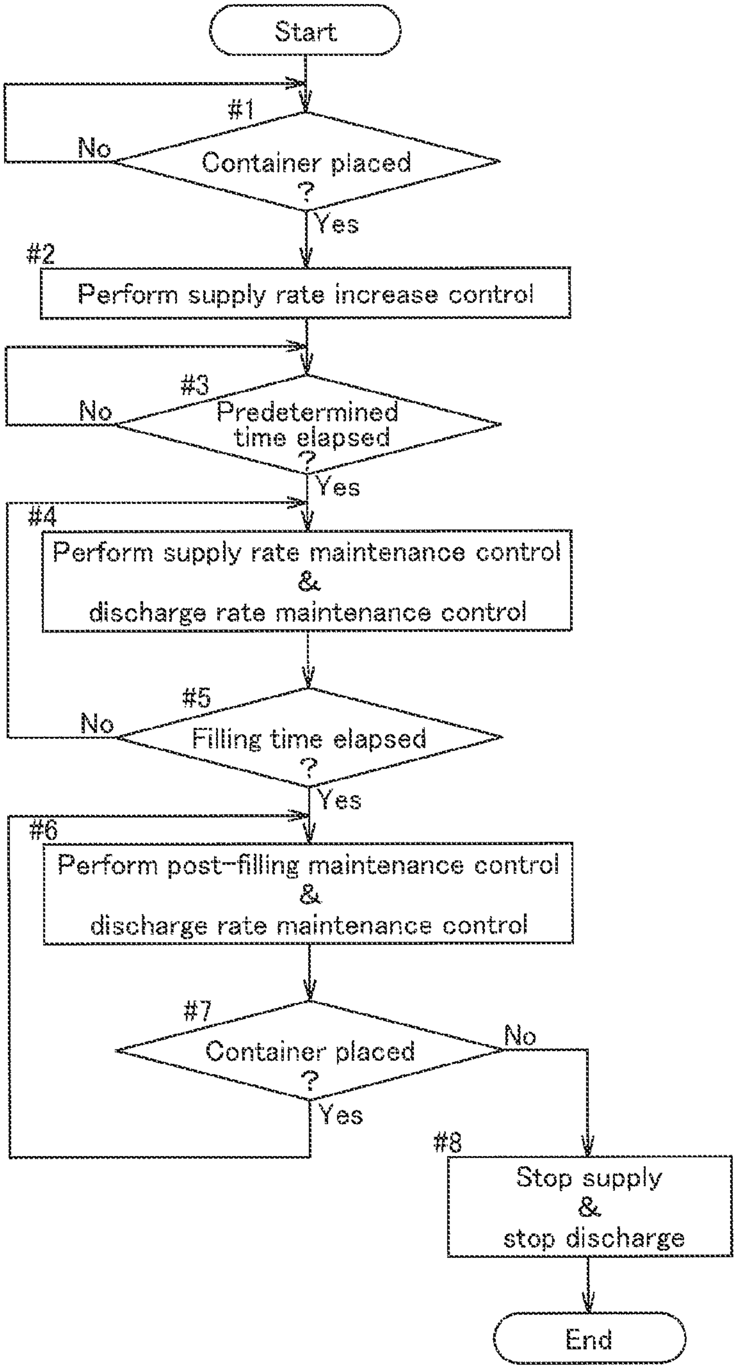
FIG. 4 is a flowchart of the purge processing.

FIG. 4 is a flowchart of purge processing. Hereinafter, a control procedure in the case of performing purge processing will be described with reference to FIG. 4.

As shown in FIG. 4, if the storage container 9 has been placed on the placement unit 10 (step #1: Yes), the supply rate control unit 23 performs the supply rate increase control Cs1 (step #2). In this example, whether or not the storage container 9 has been placed on the placement unit 10 is detected by the detection unit 12 and known by the host controller H, and the supply rate control unit 23 performs the supply rate increase control Cs1 in accordance with command from the host controller H.

After a predetermined time has elapsed since the start of supply of the purge gas (step #3), the supply rate control unit 23 executes the supply rate maintenance control Cs2, and the discharge rate control unit 33 executes the discharge rate maintenance control Ce (step #4). In this example, the measurement of the predetermined time is performed by the timer Tm provided in the host controller H. The host controller H issues various commands to the supply rate control unit 23 and the discharge rate control unit 33 based on the time measurement result from the timer Tm.

After the predetermined filling time has elapsed since the start of the processing in step #4 (step #5: Yes), the supply rate control unit 23 executes the post-filling maintenance control Cs3, and the discharge rate control unit 33 continues executing the discharge rate maintenance control Ce (step #6).

Thereafter, if the storage container 9 is no longer placed on the placement unit 10, that is to say if the storage container 9 that underwent purge processing has been carried away from the placement unit 10 (step #7: No), the supply rate control unit 23 stops the supply of the purge gas to the storage container 9, and the discharge rate control unit 33 stops the discharge of the purge gas from the storage container 9 (step #8). In this example, as shown in FIG. 3, at a time T3, the supply rate is set to zero, and the discharge rate is set to zero. Accordingly, it is possible to simultaneously stop the supply and discharge of the purge gas using the fact that the storage container 9 is not placed on the placement unit 10 as a trigger, and therefore the control configuration can be easily simplified. However, the discharge of the purge gas may be stopped after a certain period of time after the supply of the purge gas is stopped. Such a configuration can be easily realized by the time measurement performed by the timer Tm. With such a configuration, the purge gas remaining in the discharge pipe 32 can be recovered appropriately.

OTHER EMBODIMENTS

Next, other embodiments of the purging device and the container storage facility that includes the purging device will be described.

Figure 5:
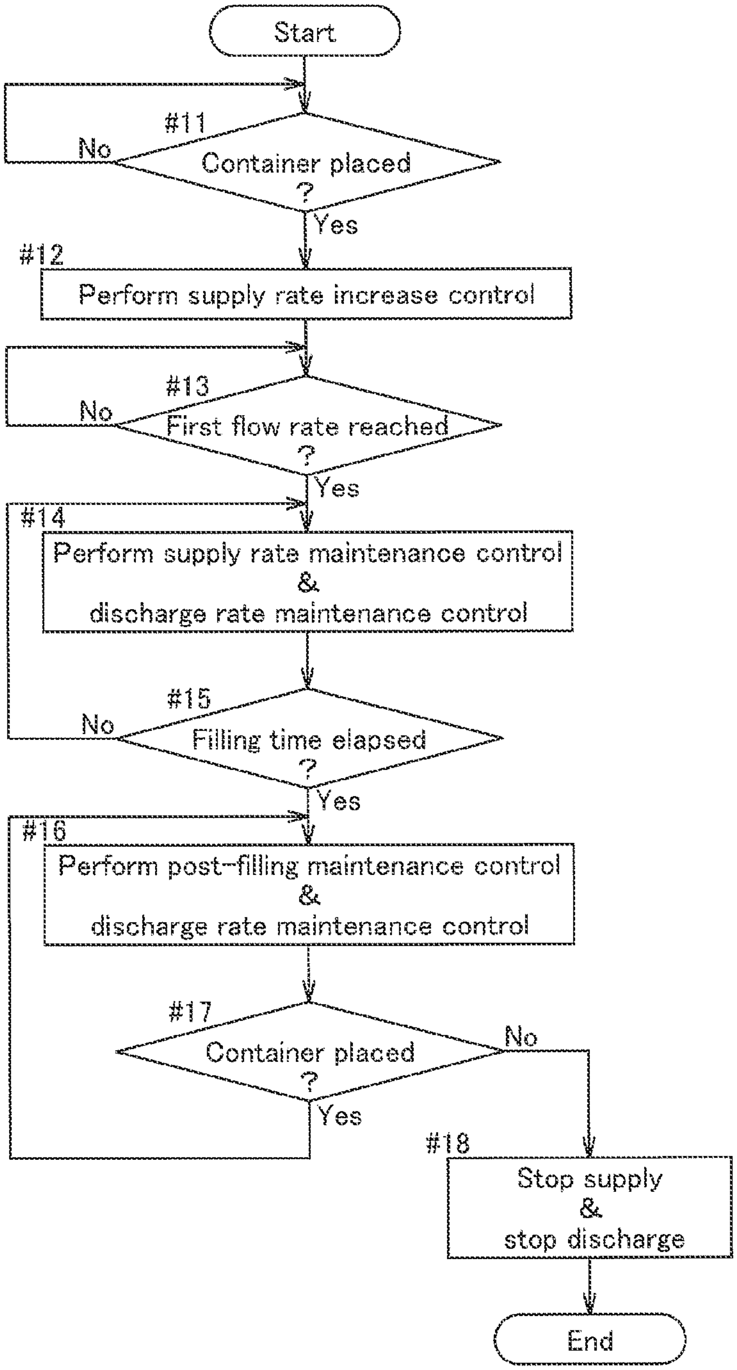
FIG. 5 is a flowchart of purge processing according to another embodiment.

(1) In the above embodiment, an example is described in which after the supply rate increase control Cs1 is started, at the predetermined elapse time T1 after the supply start time point T0, the supply rate control unit 23 performs the supply rate maintenance control Cs2 for maintaining the supply rate at the first flow rate A1 or larger. However, the present invention is not limited to such an example, and a configuration is possible in which the supply rate control unit 23 is configured to detect the flow rate of the purge gas supplied to the storage container 9, and as shown in FIG. 5 for example, if it is determined the detected supply rate has reached the first flow rate A1 (step #13: Yes), the supply rate maintenance control Cs2 is performed (step #14). Note that in the control procedure shown in FIG. 5, only the processing of step 13 is different from the control procedure shown in FIG. 4.

(2) In the above embodiment, an example is described in which the discharge rate control unit 33 keeps the discharge rate at zero for a predetermined time from the supply start time point, and then at the time T1 when the predetermined time has elapsed since the supply start time point T0, the discharge rate control unit 33 performs the discharge rate maintenance control Ce to maintain the discharge rate at or below the second flow rate A2 that is smaller than the first flow rate A1. However, the present invention is not limited to such an example, and a configuration is possible in which, as shown in FIG. 5 for example, if it is determined that the supply rate detected by the supply rate control unit 23 has reached the first flow rate A1 (step #13: Yes), the discharge rate control unit 33 performs discharge rate maintenance control Ce (step #14). In this case, the discharge rate control unit 33 may be configured to obtain information indicating that the supply rate has reached the first flow rate A1 either directly from the supply rate control unit 23 or indirectly via the host controller H.

(3) In the above embodiment, the host controller H includes the timer Tm and measures the time for each step in purge processing. However, the present invention is not limited to such an example, and the supply rate control unit 23 may include the timer Tm and perform various types of control based on the time measured by the timer Tm. Also, the discharge rate control unit 33 may include the timer Tm and perform various types of control based on the time measured by the timer Tm.

(4) In the above embodiment, an example is described in which the supply rate control unit 23 raises the supply rate at a constant rate of increase from the purge gas supply start time point T0 to the predetermined elapse time T1. However, the present invention is not limited to such an example, and the supply rate control unit 23 may raise the supply rate with a changing rate of increase.

(5) In the above embodiment, an example is described in which the discharge rate control unit 33 continues to execute the discharge rate maintenance control Ce while the supply rate control unit 23 is executing the post-filling maintenance control Cs3. However, the present invention is not limited to such an example, and a configuration is possible in which, while the supply rate control unit 23 is executing the post-filling maintenance control Cs3, the discharge rate control unit 33 discharges the purge gas at a discharge rate that is in accordance with the supply rate of the purge gas supplied in the post-filling maintenance control Cs3. For example, during execution of the post-filling maintenance control Cs3, the purge gas may be discharged at a flow rate smaller than the discharge rate of the purge gas during execution of the supply rate maintenance control Cs2.

(6) In the above embodiment, an example is described in which at the time T2 when the predetermined filling time has elapsed since the start point T1 of the supply rate maintenance control Cs2, the supply rate control unit 23 performs the post-filling maintenance control Cs3 for maintaining the supply rate at the third flow rate A3 that is smaller than the first flow rate A1 and larger than the second flow rate A2. However, the present invention is not limited to such an example, and a configuration is possible in which the supply rate control unit 23 does not perform the post-filling maintenance control Cs3.

(7) In the above embodiment, an example is described in which the supply rate control unit 23 starts supplying the purge gas to the storage container 9 if the detection unit 12 detects that the storage container 9 has been placed on the placement unit 10. However, the present invention is not limited to such an example, and a configuration is possible in which the supply of the purge gas is started regardless of the detection result from the detection unit 12. For example, the supply rate control unit 23 may operate in coordination with the transport device M and start supplying the purge gas to the storage container 9 if the transport device M has performed an operation for transferring the storage container 9. Note that the above-described coordination between the supply rate control unit 23 and the transport device M may be realized via the host controller H.

(8) In the above embodiment, an example is described in which a plurality of discharge pipes 32 are connected to one negative pressure generator 30. However, the present invention is not limited to such an example, and a negative pressure generator 30 may be provided for each of the discharge pipes 32.

(9) It should be noted that the configurations disclosed in the above embodiment can be applied in combination with configurations disclosed in the other embodiments as long as no contradiction arises. Regarding other configurations as well, the embodiments disclosed in this specification are merely examples in all respects. Therefore, various modifications can be made as appropriate without departing from the scope of the present disclosure.

Overview of Embodiments

Hereinafter, the above-described purging device and container storage facility that includes the purging device will be described.

One aspect of the present invention is a purging device configured to use a purge gas to purge an inside of a storage container in which a target object is storable, the purging device including:

- a supply pipe configured to supply the purge gas to the storage container by being connected to the storage container;
- a supply rate control unit configured to control a supply rate of the purge gas supplied to the storage container via the supply pipe;
- a discharge pipe configured to discharge the purge gas from the storage container by being connected to the storage container; and
- a discharge rate control unit configured to control a discharge rate of the purge gas discharged from the storage container via the discharge pipe,
- wherein after a start of supply of the purge gas to the storage container, the supply rate control unit performs supply rate increase control to gradually increase the supply rate in such a manner that the supply rate reaches a first flow rate, and after the supply rate reaches the first flow rate, the supply rate control unit performs supply rate maintenance control to maintain the supply rate at the first flow rate or larger, and
- the discharge rate control unit keeps the discharge rate at zero while the supply rate increase control is being executed, and, after the supply rate reaches the first flow rate, the discharge rate control unit performs discharge rate maintenance control to maintain the discharge rate at or below a second flow rate smaller than the first flow rate.

According to this configuration, the internal pressure of the storage container can possibly also be low during the period from when the supply of the purge gas to the storage container is started until when the purge gas supply rate reaches the first flow rate, but the purge gas discharge rate is set to zero during that period, thus making it possible to avoid negative pressure inside the storage container. After the supply rate of the purge gas supplied to the storage container reaches the first flow rate, the discharge of the purge gas is started, and the discharge rate is maintained at the second flow rate that is smaller than the first flow rate, and therefore the flow rate of purge gas supplied to the inside of the storage container can be maintained larger than the flow rate of purge gas discharged from the inside of the storage container. Accordingly, it is possible to prevent negative pressure in the inside of the storage container while appropriately discharging the purge gas. Therefore, it is possible to avoid the case where external air and dust are sucked into the inside of the storage container. Furthermore, according to the above configuration, the supply rate is gradually increased in the supply rate increase control, thus making it possible to minimize vibration of the target object stored in the storage container. Therefore, the purging device is particularly suitable in the case where the target object is an object that is vulnerable to vibration, such as a semiconductor wafer. As described above, according to the above configuration, it is possible to appropriately control the discharge rate of the purge gas discharged from the storage container during change in the supply rate of the purge gas supplied to the storage container, while also avoiding negative pressure in the inside of the storage container during purging.

It is preferable that the supply rate control unit performs the supply rate increase control in such a manner that the supply rate reaches the first flow rate when a predetermined time has elapsed from a supply start time point of supply of the purge gas to the storage container, and the supply rate control unit performs the supply rate maintenance control after the predetermined time has elapsed from the supply start time point, and the discharge rate control unit keeps the discharge rate at zero for the predetermined time from the supply start time point, and performs the discharge rate maintenance control after the predetermined time has elapsed from the supply start time point.

According to this configuration, adjustment of the discharge rate is triggered by the elapse of the predetermined time from the purge gas supply start time point, and therefore the control configuration can be simpler than in the case where change in the supply rate is used as a trigger, for example.

It is preferable that the predetermined time is set in such a manner that a rate of increase while the supply rate is increased to the first flow rate is in an upper limit region of a range in which the target object in the storage container does not vibrate due to the supply of the purge gas.

According to this configuration, it is possible to quickly achieve a clean state in which the inside of the storage container 9 is filled with an appropriate amount of purge gas, while also avoiding vibration of the target object inside the storage container.

It is preferable that after a predetermined filling time has elapsed from a start time point of the supply rate maintenance control, the supply rate control unit performs post-filling maintenance control to maintain the supply rate at a third flow rate smaller than the first flow rate and larger than the second flow rate, and the discharge rate control unit continues to perform the discharge rate maintenance control while the post-filling maintenance control is being executed by the supply rate control unit.

According to this configuration, after the filling of the storage container with the purge gas is complete, the post-filling maintenance control is executed to set the supply rate of the purge gas to the third flow rate that is smaller than the first flow rate such that a necessary amount of the purge gas can be stably supplied to the storage container. Such adjustment of the supply rate is also triggered by the elapse of the predetermined filling time from the start time point of the supply rate maintenance control, and therefore the control configuration can be easily simplified. Also, according to this configuration, the discharge rate maintenance control continues to be executed while the post-filling maintenance control is being executed, and therefore the purge gas continues to be discharged from the inside of the storage container at the discharge rate set to the second flow rate smaller than the third flow rate, thus making it possible to appropriately avoid negative pressure inside the storage container.

Another aspect of the present invention is a container storage facility including:

the purging device described above; and a container storage shelf including at least one placement unit on which the storage container is placeable, wherein the at least one placement unit includes:

a supply port connected to the supply pipe;

a discharge port connected to the discharge pipe; and a detection unit configured to detect that the storage container was placed on the at least one placement unit, the supply port and the discharge port are configured to be connected to the storage container while the storage container is placed on the at least one placement unit, and the supply rate control unit starts supply of the purge gas to the storage container in response to the detection unit detecting that the storage container was placed on the at least one placement unit.

According to this configuration, it is possible to avoid unnecessary consumption of the purge gas while a purging target storage container is not placed on the placement unit.

It is preferable that the at least one placement unit includes a plurality of placement units, the discharge port of each of the placement units is connected to a corresponding discharge pipe, the plurality of discharge pipes are connected to one negative pressure generator, and the discharge rate control unit includes a plurality of discharge valves respectively provided in the plurality of discharge pipes.

According to this configuration, the purge gas can be discharged from a plurality of storage containers placed on the placement units with use of one negative pressure generator. Therefore, it is easier to simplify the configuration and reduce the cost compared to the case where a negative pressure generator is provided for each of the placement units.

INDUSTRIAL APPLICABILITY

The technology according to the present disclosure is applicable to a purging device that uses a purge gas to purge the inside of a storage container for storing a target object, and a container storage facility that includes the purging device.

What is claimed is:

1. A purging device configured to use a purge gas to purge an inside of a storage container in which a target object is storable, the purging device comprising:

a supply pipe connected to the storage container and configured to supply the purge gas to the storage container;

a supply rate control unit configured to control a supply rate of the purge gas supplied to the storage container via the supply pipe;

a discharge pipe connected to the storage container and configured to discharge the purge gas from the storage container; and a discharge rate control unit configured to control a discharge rate of the purge gas discharged from the storage container via the discharge pipe, wherein, after a start of supply of the purge gas to the storage container, the supply rate control unit performs supply rate increase control to gradually increase the supply rate such that the supply rate reaches a first flow rate, and after the supply rate reaches the first flow rate, the supply rate control unit performs supply rate maintenance control to maintain the supply rate at the first flow rate or larger, wherein the discharge rate control unit keeps the discharge rate at zero while the supply rate increase control is executed and, after the supply rate reaches the first flow rate, the discharge rate control unit performs discharge rate maintenance control to maintain the discharge rate at or below a second flow rate smaller than the first flow rate, and wherein when the supply rate maintenance control includes maintaining the supply rate at the first flow rate after the supply rate reaches the first flow rate and the discharge rate maintenance control includes maintaining the discharge rate at the second flow rate, the discharge rate control unit performs the discharge rate maintenance control when the supply rate control unit performs the supply rate maintenance control such that the supply rate and the discharge rate are kept constant relative to each other.

2. The purging device according to claim 1, wherein the supply rate control unit performs the supply rate increase control such that the supply rate reaches the first flow rate when a predetermined time has elapsed from a supply start time point of supply of the purge gas to the storage container, and the supply rate control unit performs the supply rate maintenance control after the predetermined time has elapsed from the supply start time point, and wherein the discharge rate control unit keeps the discharge rate at zero for the predetermined time from the supply start time point, and performs the discharge rate maintenance control after the predetermined time has elapsed from the supply start time point.

3. The purging device according to claim 2, wherein the predetermined time is set such that a rate of increase while the supply rate is increased to the first flow rate is in an upper limit region of a range in which the target object in the storage container does not vibrate due to the supply of the purge gas.

4. The purging device according to claim 1, wherein after a predetermined filling time has elapsed from a start time point of the supply rate maintenance control, the supply rate control unit performs post-filling maintenance control to maintain the supply rate at a third flow rate smaller than the first flow rate and larger than the second flow rate, and wherein the discharge rate control unit continues to perform the discharge rate maintenance control while the post-filling maintenance control is executed by the supply rate control unit.

5. A container storage facility, comprising:

the purging device according to claim 1; and a container storage shelf comprising at least one placement unit on which the storage container is placeable, wherein the at least one placement unit comprises:

- a supply port connected to the supply pipe;
- a discharge port connected to the discharge pipe; and
- a detection unit configured to detect that the storage container was placed on the at least one placement unit, wherein the supply port and the discharge port are configured to be connected to the storage container while the storage container is placed on the at least one placement unit, and wherein the supply rate control unit starts supply of the purge gas to the storage container in response to the detection unit detecting that the storage container was placed on the at least one placement unit.

6. The container storage facility according to claim 5, wherein:

the at least one placement unit comprises a plurality of placement units, the discharge port of each of the placement units is connected to a corresponding discharge pipe, the plurality of discharge pipes are connected to one negative pressure generator, and the discharge rate control unit comprises a plurality of discharge valves respectively provided in the plurality of discharge pipes.

* * * * *